United States Patent
Oh et al.

(10) Patent No.: US 9,225,265 B2
(45) Date of Patent: Dec. 29, 2015

(54) VIBRATION GENERATION DEVICE

(71) Applicant: SAMSUNG ELECTRO-MECHANICS CO., LTD., Gyunggi-do (KR)

(72) Inventors: Hwa Young Oh, Gyunggi-do (KR); Sang Jin Lee, Gyunggi-do (KR); Dong Su Moon, Gyunggi-do (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 520 days.

(21) Appl. No.: 13/683,799

(22) Filed: Nov. 21, 2012

(65) Prior Publication Data
US 2014/0070667 A1    Mar. 13, 2014

(30) Foreign Application Priority Data

Sep. 10, 2012 (KR) ........................ 10-2012-0099990

(51) Int. Cl.
H02N 2/00 (2006.01)
G06F 3/01 (2006.01)
H01L 41/09 (2006.01)
B06B 1/06 (2006.01)
B06B 3/00 (2006.01)

(52) U.S. Cl.
CPC .............. H02N 2/001 (2013.01); B06B 1/0644 (2013.01); B06B 3/00 (2013.01); G06F 3/016 (2013.01); H01L 41/0986 (2013.01); H02N 2/005 (2013.01)

(58) Field of Classification Search
CPC ...... H01L 41/083; H01L 41/09; H01L 41/053; G01P 15/0907
USPC .......................................... 310/328, 329, 348
See application file for complete search history.

(56) References Cited

U.S. PATENT DOCUMENTS

| 2003/0127410 A1* | 7/2003 | Ito ................................. 212/332 |
| 2005/0093398 A1* | 5/2005 | Kim et al. ...................... 310/324 |
| 2005/0285453 A1* | 12/2005 | Oh et al. .......................... 310/14 |
| 2006/0002577 A1* | 1/2006 | Won et al. ..................... 381/396 |
| 2009/0174510 A1* | 7/2009 | Kim .............................. 335/222 |
| 2010/0165794 A1* | 7/2010 | Takahashi et al. ............. 367/189 |
| 2013/0043766 A1* | 2/2013 | Takahashi et al. ............. 310/326 |

FOREIGN PATENT DOCUMENTS

KR   10-2006-0000894 A   1/2006
KR   10-2012-0075939 A   7/2012

* cited by examiner

*Primary Examiner* — Shawki S Ismail
*Assistant Examiner* — Bryan Gordon
(74) *Attorney, Agent, or Firm* — McDermott Will & Emery LLP

(57) ABSTRACT

There is provided a vibration generation device, including: a housing including an inner space; a direction conversion member mounted in the housing to be disposed within the inner space; a piezoelectric actuator including a piezoelectric element fixed to the direction conversion member and horizontally deformed; and a vibrator fixed to the direction conversion member and disposed within the inner space and vertically displaced due to horizontal deformation of the piezoelectric actuator.

29 Claims, 6 Drawing Sheets

VIBRATION GENERATION DEVICE

CROSS-REFERENCE TO RELATED APPLICATIONS

This application claims the priority of Korean Patent Application No. 10-2012-0099990 filed on Sep. 10, 2012, in the Korean Intellectual Property Office, the disclosure of which is incorporated herein by reference.

BACKGROUND OF THE INVENTION

1. Field of the Invention

The present invention relates to a vibration generation device.

2. Description of the Related Art

A vibration generation device, a component that converts electrical energy into mechanical vibrations by using a principle of electromagnetic force generation, is mounted in a cellular phone to be used for silently informing a user of call receipt.

Further, there is growing demand for multi-functional cellular phones as the market for cellular phones rapidly expands. Since demand for small, high-quality cellular phone components is increased according to the expanded market for cellular phones, demand for product development of a vibration generation device having a new structure having remarkably improved quality while improving on defects of existing products has increased.

As a release of cellular phones having a large LCD screen has suddenly increased in recent years, a vibration generation device for generating vibrations at the time of a touch has been adopted due to the use of a touchscreen.

First, the vibration generation device used in a cellular phone in which a touchscreen is adopted is more frequently used to generate vibrations than merely at the time of call reception, and therefore, the operational lifespan of the vibrator needs to be increased. Second, the vibration generation device needs to have a rapid response speed, keeping pace with a user's speed of touching a touchscreen.

A cellular phone currently adopting a touchscreen uses a linear vibrator according to the demand for extended lifespan and responsiveness.

The linear vibrator does not use a rotation principle of a rotary motor, but may linearly resonate a mover connected to a spring by using a weight body connected with an elastic member mounted within the vibrator, using the electromagnetic force of a coil and a magnet to generate vibrations.

Further, vibrations may be generated by linearly resonating a mover according to the contraction and expansion of a piezoelectric element used as an actuator.

In addition, a spring has been generally used as the elastic member. Here, as the spring, a leaf spring, a coil spring, or the like, has been used. However, the lifespan of the spring may be limited due to a rupture thereof or the like. Further, when physical properties of the spring are changed due to a climatic environment, or the like, the spring may be more easily ruptured.

In addition, vibration force may be weakened or noise may occur at the time of occurrence of an abnormal operating mode (torsion, left and right shaking, and the like) of the spring.

SUMMARY OF THE INVENTION

An aspect of the present invention provides a vibration generation device having a rapid response time using an elastic member having a linear shape while using a piezoelectric element as an actuator.

According to an aspect of the present invention, there is provided a vibration generation device, including: a housing including an inner space; a direction conversion member mounted in the housing to be disposed within the inner space; a piezoelectric actuator including a piezoelectric element fixed to the direction conversion member and horizontally deformed; and a vibrator fixed to the direction conversion member and disposed within the inner space, and vertically displaced due to horizontal deformation of the piezoelectric actuator.

The direction conversion member may include: at least two lower elastic members provided to intersect with one another and having lower ends mounted in the housing and upper ends extending to be located in the inner space; upper elastic members provided to intersect with one another and having upper ends fixed to the vibrator, and extended in directions corresponding to the respective lower elastic members to allow lower ends thereof to be located below the upper ends and provided with the same number of the lower elastic members; and connection parts respectively connecting the upper ends of the lower elastic members to the lower ends of the upper elastic members, wherein the piezoelectric actuator is disposed so that the horizontal ends thereof are respectively fixed to the connection parts.

The direction conversion member may include: first and second lower elastic members provided to intersect with one another and having lower ends mounted in the housing and having upper ends extending to be located in the inner space; first and second connection parts respectively protruded from the upper ends of the first and second lower elastic members so that upper ends of the first and second lower elastic members are located above lower ends thereof; and first and second upper elastic members extendedly provided from the upper ends of the first and second connection parts to respectively face the first and second lower elastic members so that the first and second upper elastic members intersect with one another, and having upper ends located above lower ends to be respectively fixed to the vibrator.

Both ends of the piezoelectric actuator in a horizontal direction may respectively be fixed to the first and second connection parts.

The piezoelectric actuator may be disposed between the first and second upper elastic members and the first and second lower elastic members.

The first lower elastic member, the first connection part and the first upper elastic member may be integrally formed with the second lower elastic member, the second connection part and the second upper elastic member, respectively, and a boundary between the members may be bent.

The first and second connection parts may be provided in parallel with a vertical direction.

The upper ends of the first and second upper elastic members may respectively be provided with first and second vibrator mounting members, and the first and second vibrator mounting members may include first and second support plates horizontally provided on the upper ends of the first and second upper elastic members and first and second side plate respectively protruded horizontally from both sides of the first and second support plates in a width direction.

The first upper and lower elastic members may be provided with vertical upper and lower insertion grooves, and the second upper and lower elastic members may respectively be fitted in the upper and lower insertion grooves to intersect with one another.

Widths of the upper and lower insertion grooves may be larger than those of the second upper and lower elastic members.

The second connection part may further be provided with a piezoelectric actuator support part extendedly provided in the width direction.

A portion at which the first and second upper elastic members and the first and second lower elastic members respectively intersect with one another may be the same position in the horizontal direction.

The first and second upper elastic members and the first and second lower elastic members may intersect with one another at a horizontal center.

Lower ends of the first and second lower elastic members may be mounted in the housing while being horizontally spaced apart from each other by a predetermined interval.

Lengths of the first and second lower elastic members and the first and second upper elastic members may range from 60% or more through 300% or less of a horizontal length of the piezoelectric element.

The horizontal lengths of first and second lower elastic members and the first and second upper elastic members may range from five times through 1000 times a vertical height thereof.

The housing may include a bracket on which the direction conversion member is mounted and a case covering the bracket and integrated with the bracket to provide an inner space.

The vibration generation device may further include: a substrate attached to the bracket to extend in the inner space and supplying power to the piezoelectric actuator.

The vibrator may be a weight formed of a high density material.

The weight may be provided to be longer than the piezoelectric actuator horizontally.

The weight may be provided with a weight adding part extending vertically downwardly from an outer end of the piezoelectric actuator.

At least any one member at a portion which the vibrator and the inner surface of the housing face each other may be provided with a damper.

The damper may be disposed on an outer end of the vibrator or the inner surface of the housing opposed thereto.

The damper may be formed of a material including at least any one of urethane foam, silicon foam, and rubber.

The damper may be an elastic body and may be formed of a noise absorbing material.

The vibration generation device may further include: an additional elastic member having one end fixed to the vibrator and the other end fixed to the housing.

The additional elastic member may be at least one coil spring or at least one leaf spring.

The piezoelectric element may have a quadrangular pillar shape in which a length in a horizontal direction is longer than that in a vertical direction.

The housing may have a quadrangular pillar shape in which a length in a horizontal direction is longer than that in a vertical direction.

According to another aspect of the present invention, there is provided a vibration generation device including: a housing including an inner space; an elastic member mounted in the housing to be disposed within the inner space; a piezoelectric actuator including a piezoelectric element fixed to the elastic member and deformed in one direction; and a vibrator fixed to the elastic member to be disposed within the inner space and vibrating in a direction perpendicular to the one direction due to deformation of the piezoelectric actuator in one direction.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
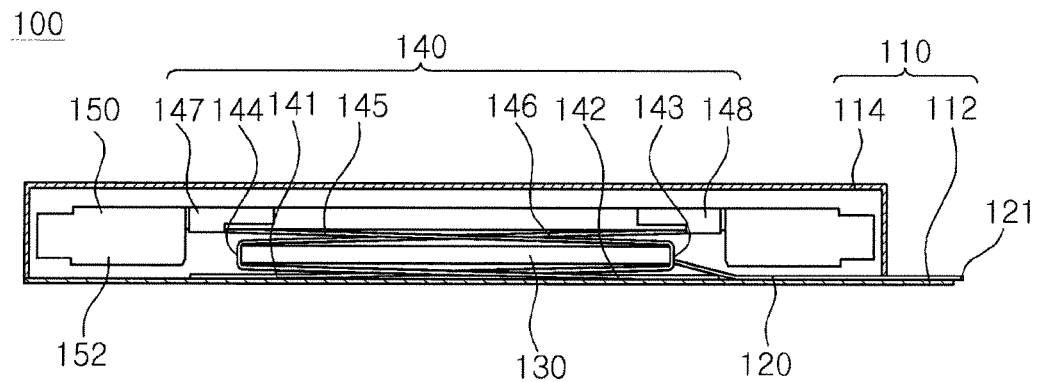
FIG. 1 is a schematic cross-sectional view of a vibration generation device according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2:
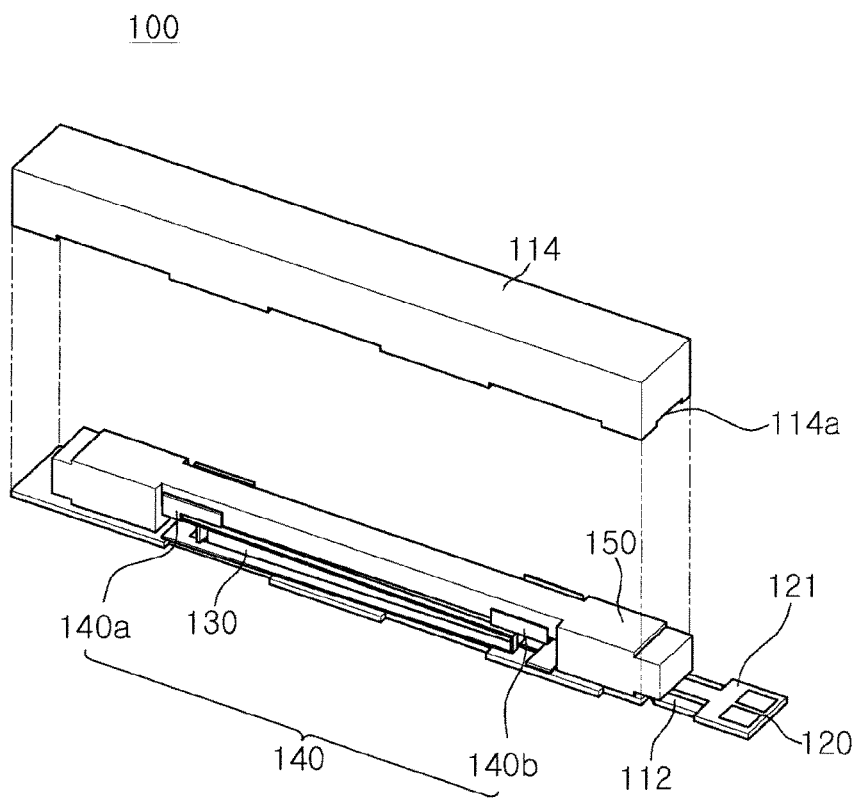
FIG. 2 is a combined perspective view of the vibration generation device according to the embodiment of the present invention.
Figure 3:
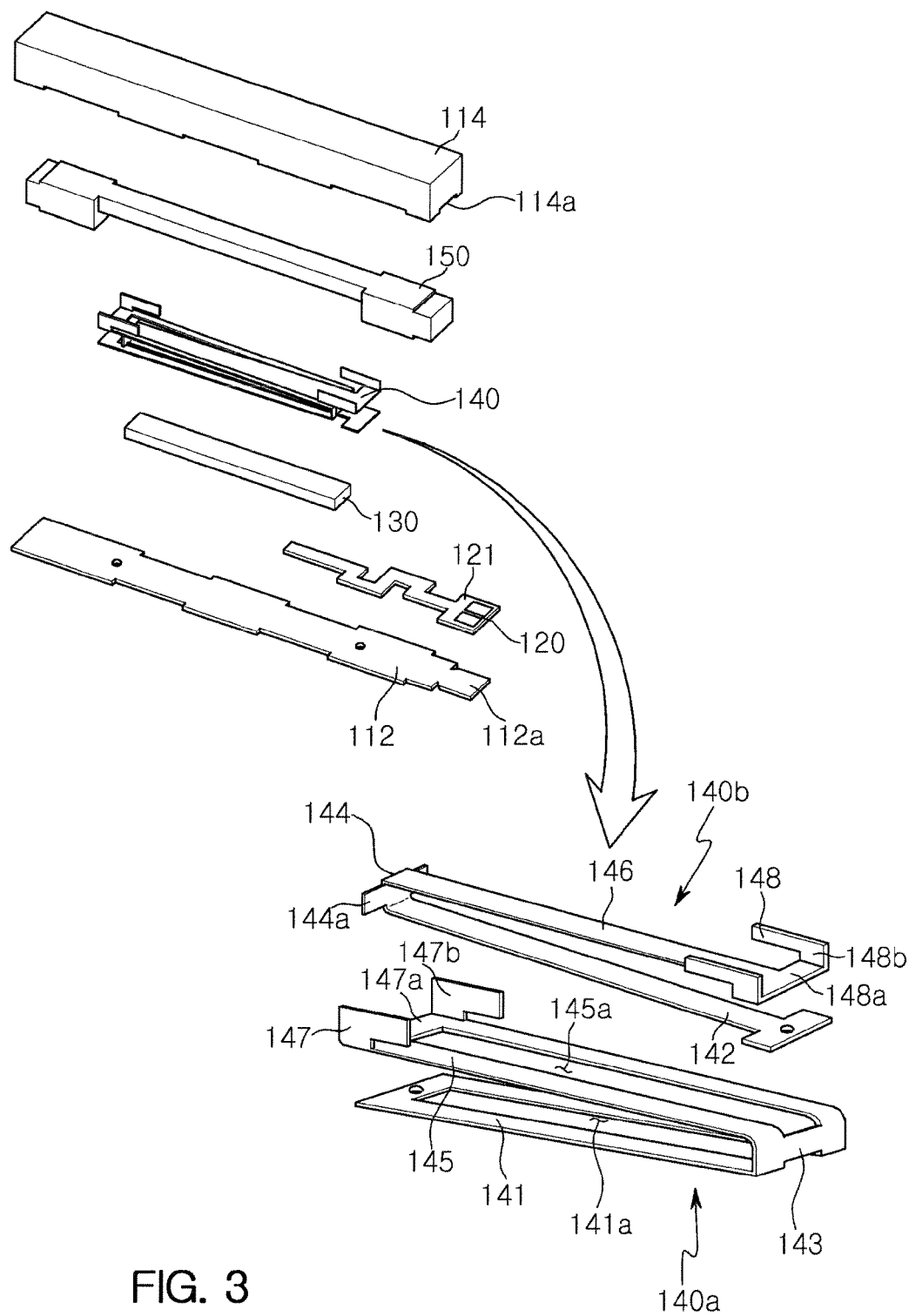
FIG. 3 is an exploded perspective view of the vibration generation device according to the embodiment of the present invention.
Figure 4A:
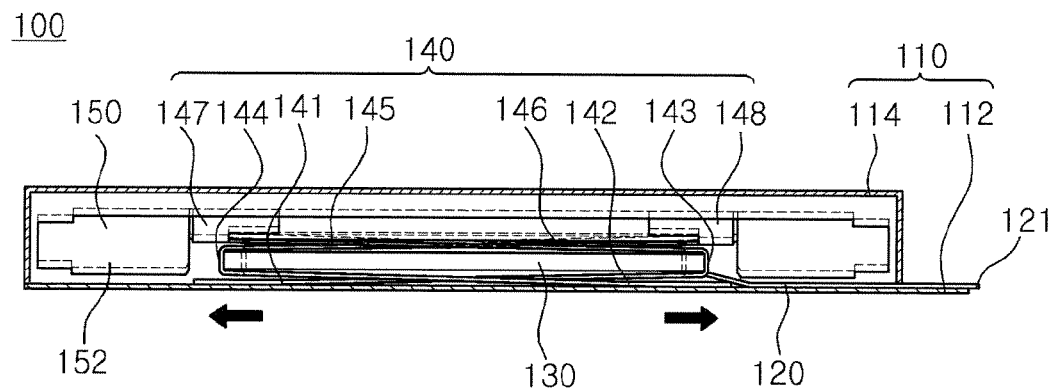
FIGS. 4A and 4B are explanation diagrams showing an operation of the vibration generation device according to the embodiment of the present invention.
Figure 4B:
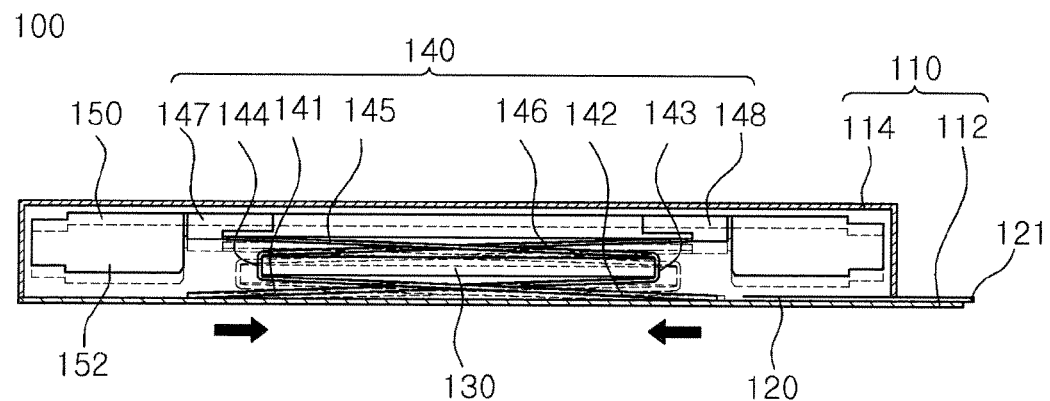

FIG. 1 is a schematic cross-sectional view of a vibration generation device according to an embodiment of the present invention, FIG. 2 is a combined perspective view of the vibration generation device according to the embodiment of the present invention, FIG. 3 is an exploded perspective view of the vibration generation device according to the embodiment of the present invention, and FIGS. 4A and 4B are explanation diagrams showing an operation of the vibration generation device according to the embodiment of the present invention.

Referring to FIGS. 1 through 4, a vibration generation device 100 according to an embodiment of the present invention may include a housing 110 forming a casing of the vibration generation device 100, a substrate 120 for supplying power, a piezoelectric actuator 130 horizontally contracted and expanded due to a supply of power, a direction conversion member 140 fixed to the piezoelectric actuator 130, and a vibrator (weight) 150 fixed to the direction conversion member 140 to be vertically displaced due to a deformation of the piezoelectric actuator 130 in a horizontal direction.

In addition, although described with reference to FIGS. 5 through 7, the vibration generation device 100 may optionally include dampers 161 and 162, coil springs 171 and 172, leaf springs 181 and 182, and the like.

First, when defining terms for directions, a horizontal direction may refer to a left and right direction in FIG. 1, that is, a length direction from one portion of the piezoelectric actuator 130 or the vibrator 150 toward the other portion and a vertical direction may refer to a top and bottom direction in FIG. 1, that is, a direction (that is, a height direction) toward a top surface from a bottom surface of the piezoelectric actuator 130 or the vibrator 150. However, the horizontal direction does not refer to a specific direction but may include all horizontal directions and the vertical direction may include all directions perpendicular to the horizontal direction.

Meanwhile, a width direction may refer to a direction in which any one of a length and a breadth has a short length with respect to a longer member. For example, when a breadth is longer than a length, a length direction may be a width direction.

In addition, a main surface may refer to the widest surface in, a predetermined member, for example, the piezoelectric actuator 130 or the vibrator 150.

Further, an outer side of a predetermined member may refer to a left and right direction as a horizontal direction based on an approximate center of the vibrator 150, but an inner side of a predetermined member may refer to an approximate central direction of the vibrator 150 from the left and right in the horizontal direction.

The housing 110 has an inner space and forms a casing of the vibration generation device 100. The housing 110 may include a bracket 112 and a case 114. The bracket 112 may be provided with the direction conversion member 140. Further, the bracket 112 may be provided with the substrate 120.

Further, the case 114 covers the bracket 112 and may be integrated with the bracket 112 to provide an inner space.

Here, the embodiment of the present invention has a shape in which the substrate 120 or the direction conversion member 140 is mounted on the bracket 112, but the substrate 120 or the direction conversion member 140 may also be mounted in the case 114.

The bracket 112 may have a plate shape so that a member is easily mounted therein. Further, a bottom surface of the case 114 may have an opened box shape, that is, a hexahedral shape so that the case 114 may entirely cover the bracket 112.

Further, the shape of the bracket 112 or the case 114 is not limited thereto and therefore, may have various shapes. For example, the bracket may be formed in a circular plate and the case may have a cylindrical shape providing an inner space by covering the circular plate.

The substrate 120 may be fixed to the bracket 112. The substrate 120 may be mounted on an inner surface of the housing 110 to be located in the inner space of the housing 110 and may be mounted on an outer surface of the housing 110. The substrate 120 may be a printed circuit board, in more detail, a flexible printed circuit board. Hereinafter, the case in which the substrate 120 is mounted on the inner surface of the housing 110 will be described as an embodiment.

Further, when the substrate 120 is mounted on the inner surface of the housing 110, the substrate may be provided with a terminal connection part 121 exposed to the outside of the housing 110.

Therefore, the housing 110 may be provided with a through hole 114a so that the terminal connection part 121 is exposed to the outside. In particular, a horizontal end of the case 114 may be provided with the through hole 114a. Further, the bracket 112 may be provided with a terminal support 112a protruded to the outside in a position corresponding to a position in which the through hole 114a is located, and the terminal connection part 121 may extend in a top surface of the terminal support 112a.

Meanwhile, the substrate 120 may be fixed to the top surface of the bracket 112. In the embodiment of the present invention, the vibrator is vibrated in the inner space and therefore, the substrate 120 extends to a portion in which the piezoelectric actuator 130 is located in the state in which the substrate 120 is fixed to the bracket 112 not to contact the vibrator, such that the substrate 120 may be connected with the piezoelectric actuator 130.

The housing 110 may be provided with the direction conversion member 140 to be located in the inner space thereof. An upper portion of the direction conversion member 140 is provided with the vibrator (weight) 150 to be described below. The direction conversion member 140 may vertically displace the vibrator 150 mounted on the upper portion thereof according to a deformation (expansion or contraction) of the piezoelectric actuator 130 mounted inside the direction conversion member 140 in a horizontal direction.

The direction conversion member 140 may be provided with at least two members that include a lower elastic member, a connection part, and an upper elastic member and that intersect with one another.

Described in detail, the direction conversion member 140 may include at least two lower elastic members provided to intersect with one another and extending to have lower ends mounted in the housing 110 and upper ends located in the inner space; upper elastic members provided to intersect with one another, extending in a direction corresponding to respective lower elastic members so that lower ends of the upper elastic members are located below the upper ends thereof and the upper ends thereof are fixed to the vibrator 150, and provided in the same number as the number of lower elastic members; and connection parts respectively connecting the upper ends of the lower elastic members to the lower ends of the upper elastic members. Here, the piezoelectric actuator 130 may be disposed inwardly of the direction conversion member 140 so that the horizontal ends are respectively fixed to the connection parts.

Hereinafter, the case in which the direction conversion member 140 is configured of a pair of first and second direction conversion members 140a and 140b will be described as an embodiment of the present invention. However, the direction conversion member 140 is not limited thereto and therefore, may be provided in a manner in which three or more direction conversion members intersect with one another.

The direction conversion member 140 may include the first and second direction conversion members 140a and 140b provided to intersect with one another. However, the first and second direction conversion members 140a and 140b intersect with one another but are not fixed to each other even at any portion.

The first direction conversion member 140a may include a first lower elastic member 141, a first connection part 143, and a first upper elastic member 145. Optionally, a first vibrator mounting member 147 may be provided over the first upper elastic member 145.

Further, the second direction conversion member 140b may include a second lower elastic member 142, a second connection part 144, and a second upper elastic member 146. Optionally, a second vibrator mounting member 148 may be provided over the second upper elastic member 146.

The first and second lower elastic members 141 and 142 are provided to intersect with one another and may extend so that lower ends thereof are mounted in the housing 110 (in more detail, the bracket 112 or the case 114) and upper ends thereof are located in the inner space of the housing 110. Here, the upper ends of the first and second lower elastic members 141 and 142 may be located above the lower ends thereof.

Here, the lower ends of the first and second lower elastic members 141 and 142 may be mounted in the housing 110 while being horizontally spaced apart from each other by a predetermined interval.

Further, the direction conversion member 140 may be provided with the first and second connection parts 143 and 144 respectively, vertically protruded from the upper ends of the first and second lower elastic members 141 and 142.

Further, the direction conversion member 140 may be provided with the first and second upper elastic members 145 and 146 that extend from upper ends of the first and second connection parts 143 and 144 to face the first and second lower elastic members 141 and 142, respectively, so that the first and second upper elastic members 145 and 146 intersect with one another and have the upper ends thereof located above the lower ends thereof, the respective upper ends thereof being fixed to the vibrator 150 (weight).

Here, the first lower elastic member 141, the first connection part 143, and the first upper elastic member 145 provided in the first direction conversion member 140a may be integrally provided, wherein a boundary between respective members may be bent.

Further, the second lower elastic member 142, the second connection part 144, and the second upper elastic member 146 provided in the second direction conversion member 140b may be integrally provided, wherein a boundary between respective members may be bent.

Further, the first and second connection parts 143 and 144 may be provided in parallel with a vertical direction.

Here, the first upper and lower elastic members 145 and 141 are provided with vertical upper and lower insertion grooves 145a and 141a and the second upper and lower elastic members 146 and 142 are respectively inserted into the upper and lower insertion grooves 145a and 141a to intersect with one another. The widths of the upper and lower insertion grooves 145a and 141a may be provided to be larger than those of the second upper and lower elastic members 146 and 142 so that the upper and lower insertion grooves 145a and 141a do not interfere the second upper and lower elastic members 146 and 142 inserted thereinto.

Further, the portions at which the first and second upper elastic members 145 and 146 respectively intersect the first and second lower elastic members 141 and 142 may be the same position in a horizontal direction. In more detail, the first and second upper elastic members 145 and 146 and the first and second lower elastic members 141 and 142 may intersect with one another on a horizontal center.

In addition, the upper ends of the first and second upper elastic members 145 and 146 may respectively be provided with the first and second vibrator mounting members 147 and 148.

The first and second vibrator mounting members 147 and 148 may include first and second support plates 147a and 148a fixed to the upper ends of the first and second upper elastic members 145 and 146 and first and second side plates 147b and 148b that respectively are vertically protruded from both sides of the first and second support plates 147a and 148a.

By this configuration, the vibrator 150 may be inserted into a space formed by the first and second support plates 147a and 148a and the first and second side plates 147b and 148b.

Here, the upper ends of the first and second upper elastic members 145 and 146 may serve as the first and second support plates 147a and 148b.

In addition, the widths of the first upper and lower elastic members 145 and 141 may be provided to be smaller than those of the upper and lower insertion grooves 145a and 141a, such that the second connection part 144 may further include a piezoelectric actuator support part 144a provided to extend horizontally.

Meanwhile, the horizontal length of the first and second lower elastic members 141 and 142 and the first and second upper elastic members 145 and 146 may range from five times through 1000 times the vertical height thereof.

Further, the lengths of the first and second lower elastic members 141 and 142 and the first and second upper elastic members 145 and 146 may range from 60% or more through 300% or less of the horizontal length of the piezoelectric element included in the piezoelectric actuator 130.

Further, the lengths of the first and second lower elastic members 141 and 142 and the first and second upper elastic members 145 and 146 may be the same.

The foregoing direction conversion member 140 may include the first and second direction conversion members 140a and 140b of which the upper ends are fixed to the vibrator 150 and the lower ends are fixed to the housing 110. Further, the first and second connection parts 143 and 144 mounted on the first and second direction conversion members 140a and 140b may be fixed with both ends of the piezoelectric actuator 130. Therefore, the upper ends and the lower ends of the first and second direction conversion members 140a and 140b respectively are indirectly connected by the vibrator 150 and the housing 110. That is, the interval between the upper ends and the lower ends of the first and second direction conversion members 140a and 140b is constantly maintained even when the piezoelectric actuator 130 is horizontally expanded and contracted.

Therefore, when the piezoelectric actuator 130 is horizontally expanded or contracted, the first and second connection parts 143 and 144 are horizontally displaced inwardly or outwardly while a slope of the first and second upper elastic members 145 and 146 and the first and second lower elastic members 141 and 142 included in the first and second direction conversion members 140a and 140b is changed. As a result, the vibrator 150 is vertically vibrated downwardly or upwardly.

Described in more detail with reference to the drawings, FIG. 4A shows a shape in which the piezoelectric actuator 130 is expanded horizontally and FIG. 4B shows a shape in which the piezoelectric actuator 130 is contracted horizontally.

Referring to FIG. 4A, as the piezoelectric actuator 130 is expanded horizontally, the first and second connection parts 143 and 144 to which both ends of the piezoelectric actuator 130 are fixed are horizontally moved outwardly. Therefore, the vibrator 150 mounted on the upper ends of the first and second upper elastic members 145 and 146 are vertically displaced downwardly while the slope of the first and second upper elastic members 145 and 146 and the first and second lower elastic members 141 and 142 with which the upper and lower ends thereof are indirectly connected is smooth.

Referring to FIG. 4B, as the piezoelectric actuator 130 is contracted horizontally, the first and second connection parts 143 and 144 to which both ends of the piezoelectric actuator 130 are fixed are horizontally moved inwardly. Therefore, the vibrators 150 mounted on the upper ends of the first and second upper elastic members 145 and 146 are vertically displaced upwardly while the slope of the first and second upper elastic members 145 and 146 and the first and second lower elastic members 141 and 142 with which the upper and lower ends thereof are indirectly connected is steep.

As illustrated in FIGS. 4A and 4B, as the piezoelectric actuator 130 is repeatedly expanded or contracted horizontally, the vibrators 150 mounted on the upper ends of the first and second direction conversion members 140a and 140b are vertically vibrated downwardly or upwardly.

The direction conversion member 140 may be provided with the piezoelectric actuator 130. Described in detail, the piezoelectric actuator 130 may be mounted to be located in the inner space of the housing 110. That is, the piezoelectric actuator 130 may be disposed between the first and second upper elastic members 145 and 146 and the first and second lower elastic members 141 and 142.

The piezoelectric actuator 130 may be extendedly mounted horizontally. Both ends of the piezoelectric actuator 130 may be horizontally fixed to the first and second connection parts 143 and 144.

The piezoelectric actuator 130 may include an electrode and a piezoelectric element. As power is applied to the electrode, the piezoelectric element may be repeatedly expanded and contracted horizontally.

The piezoelectric element may be formed of a piezoelectric material, specifically, a lead zirconate titanate (PZT) ceramic material, or the like, but is not limited thereto.

The upper portion of the direction conversion member 140 may be provided with the vibrator 150. The vibrator 150 may be a weight formed of a high density material. The vibrator 150 may be formed of copper-based materials such as brass or a tungsten material.

The vibrator 150 may be extendedly disposed in a horizontal direction. That is, the vibrator 150 is disposed to be longer than the piezoelectric actuator 130 horizontally and may include a portion protruded outwardly from the outer end of the piezoelectric actuator 130.

The vibrator 150 may be provided with a weight adding part 152 extending downwardly vertically from the outer end of the piezoelectric actuator 130. The weight adding part 152 is integrally provided with the vibrator 150 and may be separately provided from the vibrator 150.

FIGS. 5 through 7B are schematic cross-sectional views of a vibration generation device according to an embodiment of the present invention. Hereinafter, a member that may be additionally included in the vibration generation device 100 according to the embodiment of the present invention described with reference to FIGS. 1 through 4 will be described. Hereinafter, only components differentiated from the vibration generation device 100 according to the embodiment of the present invention described with reference to FIGS. 1 to 4 are described and a description of the remaining components may be substituted with the foregoing description.

Figure 5:
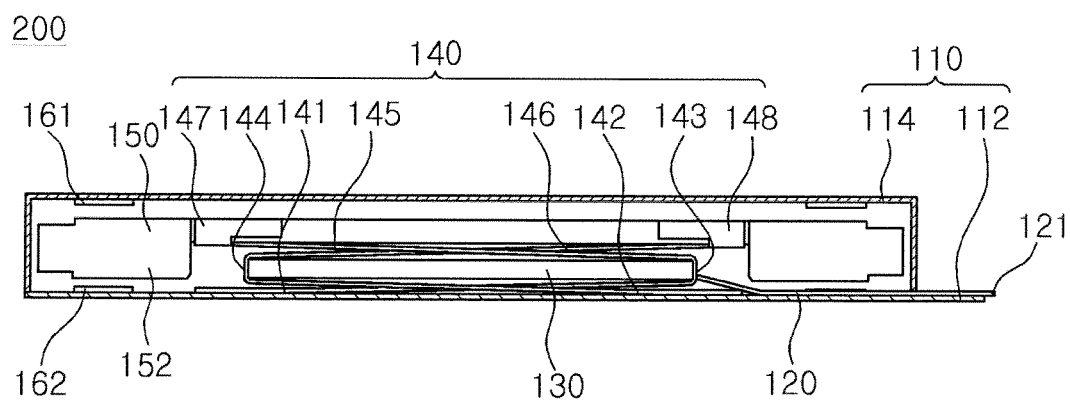
FIGS. 5 through 7B are schematic cross-sectional views of a vibration generation device according to an embodiment of the present invention.

Referring to FIG. 5, a vibration generation device 200 according to an embodiment of the present invention may include dampers 161 and 162 mounted on the inner surface of the housing 110. That is, the inner space of the housing 110 is provided with the vibrator 150 and thus, the vibrator 150 is vibrated vertically, such that the vibrator 150 may vertically contact the inner surface of the housing 110.

Therefore, the inner surface of the housing 110 may be provided with the dampers 161 and 162 in a vertical direction.

FIG. 5 shows only the case in which the damper is provided on the inner surface of the housing 110, but the damper may also be provided on the vertical top surface or the vertical bottom surface of the vibrator 150.

In particular, the dampers 161 and 162 may be disposed on the outer end of the vibrator 150 or the inner surface of the housing 110 opposed thereto.

The dampers 161 and 162 may be an elastic body and may be formed of materials including at least any one of urethane foam, silicon foam, and rubber to absorb noise. In particular, the dampers 161 and 162 may be formed of PORON®.

Figure 6A:
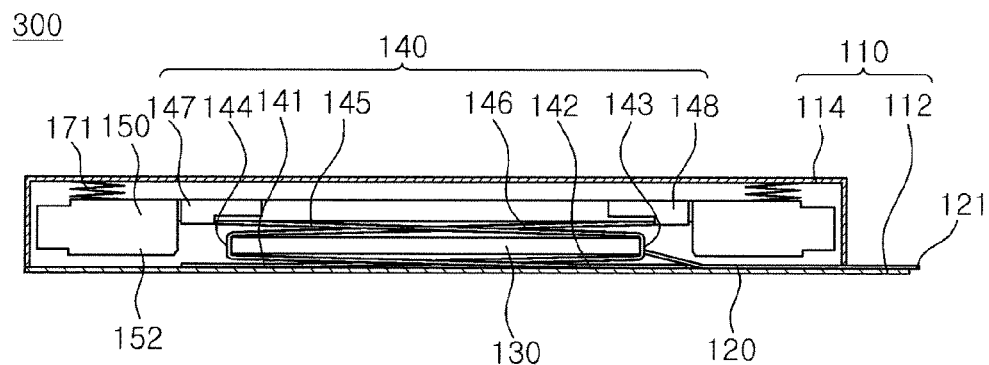
Figure 6B:
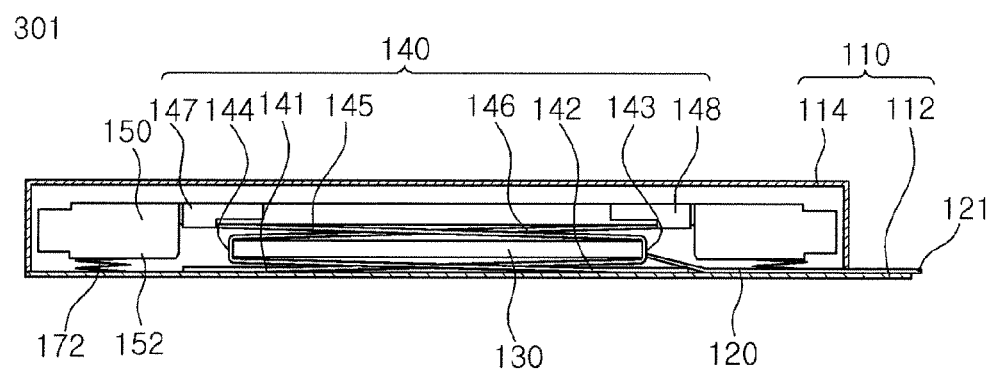

Referring to FIGS. 6A and 6B, vibration generation devices 300 and 301 according to an embodiment of the present invention may further include an additional elastic member mounted between the inner surface of the housing 110 and the vibrator 150.

The additional elastic member may be coil springs 171 and 172. At least one of the coil springs 171 and 172 may be mounted between the outer end of the vibrator 150 and the inner surface of the housing 100 facing the outer end of the vibrator 150.

The coil spring 171 may be provided between the top surface of the vibrator 150 and a ceiling surface (case 114) of the housing 110 or the coil spring 172 may be provided between the bottom surface of the vibrator 150 and the bottom surface (bracket 112) of the housing 110.

The additional elastic member may add the vibration force to the vibrator 150, in addition to the vibration generated by the piezoelectric actuator 130.

Figure 7A:
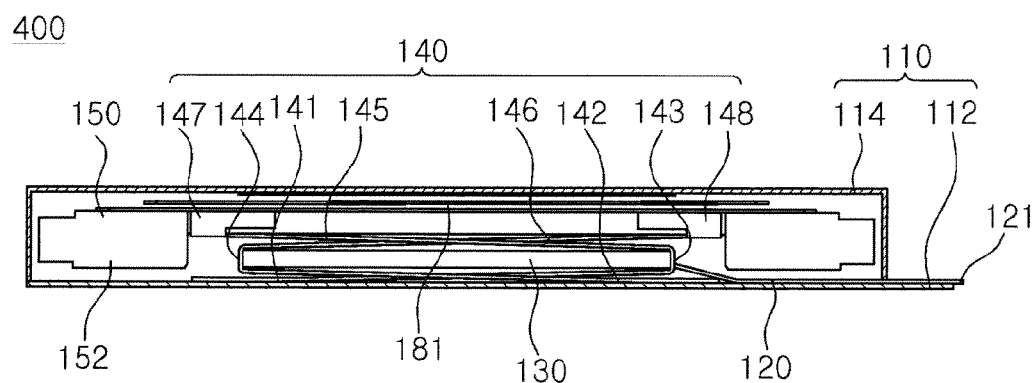
Figure 7B:
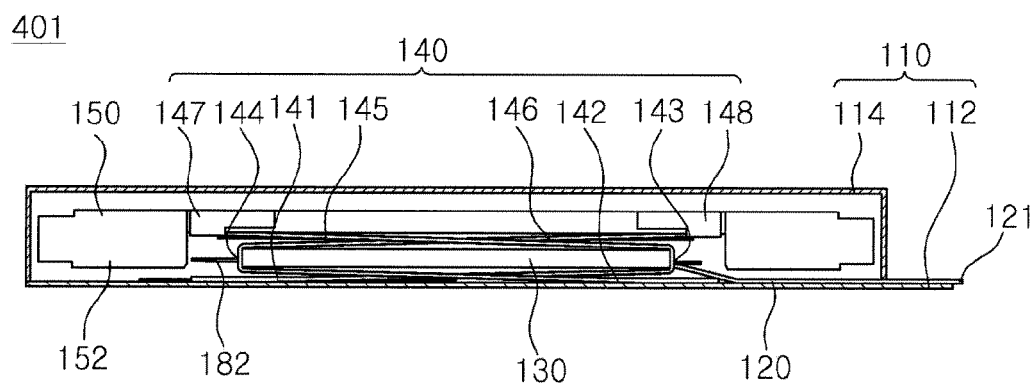

Referring to FIGS. 7A and 7B, vibration generation devices 400 and 401 according to an embodiment of the present invention may further include an additional elastic member mounted between the inner surface of the housing 110 and the vibrator 150.

The additional elastic member may be leaf springs 181 and 182. The leaf springs 181 and 182 may be mounted between the vibrator 150 and the inner surface of the housing 110 facing the vibrator 150.

The leaf spring 181 may be provided between the top surface of the vibrator 150 and the ceiling surface (case 114) of the housing 110 or the leaf spring 182 may be provided between the bottom surface of the vibrator 150 and the bottom surface (bracket 112) of the housing 110.

Meanwhile, when the leaf spring 181 is provided between the bottom surface of the vibrator 150 and the bottom surface (bracket 112) of the housing 110, a center of the leaf spring 181 approximately coincides with a center of the vibrator 150 and may be formed to have a shape enclosing the piezoelectric actuator 130 and the direction conversion member 140.

The additional elastic member may add the vibration force to the vibrator 150, in addition to the vibration generated by the piezoelectric actuator 130.

As set forth above, according to the embodiments of the present invention, the vibration generation device capable of implementing the rapid responsiveness using the elastic member having a linear shape while using the piezoelectric element as the actuator may be provided.

While the present invention has been shown and described in connection with the embodiments thereof, it will be apparent to those skilled in the art that modifications and variations can be made without departing from the spirit and scope of the invention as defined by the appended claims.

What is claimed is:

1. A vibration generation device, comprising:
   a housing including an inner space;
   a direction conversion member mounted in the housing to be disposed within the inner space;
   a piezoelectric element fixed to the direction conversion member and horizontally deformed; and
   a vibrator fixed to the direction conversion member and disposed within the inner space and vertically displaced due to horizontal deformation of the piezoelectric element,
   wherein the direction conversion member includes at least two lower elastic members provided to intersect with one another and having lower ends mounted in the housing and upper ends extended to be located in the inner space.

2. The vibration generation device of claim 1, wherein the direction conversion member further includes:
   upper elastic members provided to intersect with one another and having upper ends fixed to the vibrator, and extended in directions corresponding to the respective lower elastic members to allow lower ends thereof to be located below the upper ends and provided with the same number of the lower elastic members; and connection parts respectively connecting the upper ends of the lower elastic members to the lower ends of the upper elastic members, the piezoelectric element being disposed so that the horizontal ends thereof are respectively fixed to the connection parts.

3. The vibration generation device of claim 1, wherein the at least two lower elastic members are first and second lower elastic members provided to intersect with one another and having lower ends mounted in the housing and having upper ends extended to be located in the inner space; and wherein the direction conversion member further includes:
first and second connection parts respectively protruded from the upper ends of the first and second lower elastic members so that upper ends of the first and second lower elastic members are located above lower ends thereof; and first and second upper elastic members extendedly provided from the upper ends of the first and second connection parts to respectively face the first and second lower elastic members so that the first and second upper elastic members intersect with one another, and having upper ends located above lower ends to be respectively fixed to the vibrator.

4. The vibration generation device of claim 3, wherein both ends of the piezoelectric element in a horizontal direction are respectively fixed to the first and second connection parts.

5. The vibration generation device of claim 3, wherein the piezoelectric element is disposed between the first and second upper elastic members and the first and second lower elastic members.

6. The vibration generation device of claim 3, wherein the first lower elastic member, the first connection part and the first upper elastic member are integrally formed with the second lower elastic member, the second connection part and the second upper elastic member, respectively, and a boundary between the members is bent.

7. The vibration generation device of claim 3, wherein the first and second connection parts are provided in parallel with a vertical direction.

8. The vibration generation device of claim 3, wherein the upper ends of the first and second upper elastic members are respectively provided with first and second vibrator mounting members, and the first and second vibrator mounting members include first and second support plates horizontally provided on the upper ends of the first and second upper elastic members and first and second side plates respectively protruded horizontally from both sides of the first and second support plates in a width direction.

9. The vibration generation device of claim 3, wherein the first upper and lower elastic members are provided with vertical upper and lower insertion grooves, and the second upper and lower elastic members are respectively fitted in the upper and lower insertion grooves to intersect with one another.

10. The vibration generation device of claim 9, wherein widths of the upper and lower insertion grooves are larger than those of the second upper and lower elastic members.

11. The vibration generation device of claim 9, wherein the second connection part is further provided with a piezoelectric actuator support part extendedly provided in the width direction.

12. The vibration generation device of claim 3, wherein a portion at which the first and second upper elastic members and the first and second lower elastic members respectively intersect with one another is the same position in the horizontal direction.

13. The vibration generation device of claim 3, wherein the first and second upper elastic members and the first and second lower elastic members intersect with one another at a horizontal center.

14. The vibration generation device of claim 3, wherein lower ends of the first and second lower elastic members are mounted in the housing while being horizontally spaced apart from each other by a predetermined interval.

15. The vibration generation device of claim 3, wherein lengths of the first and second lower elastic members and the first and second upper elastic members are ranging from 60% or more through 300% or less of a horizontal length of the piezoelectric element.

16. The vibration generation device of claim 3, wherein the horizontal lengths of the first and second lower elastic members and the first and second upper elastic members are ranging from five times through 1000 times a vertical height thereof.

17. The vibration generation device of claim 1, wherein the housing includes a bracket on which the direction conversion member is mounted and a case covering the bracket and integrated with the bracket to provide an inner space.

18. The vibration generation device of claim 1, further comprising a substrate attached to the bracket to extend in the inner space and supplying power to the piezoelectric element.

19. The vibration generation device of claim 1, wherein the vibrator is a weight formed of a high density material.

20. The vibration generation device of claim 19, wherein the weight is provided to be longer than the piezoelectric element horizontally.

21. The vibration generation device of claim 20, wherein the weight is provided with a weight adding part extending vertically downwardly from an outer end of the piezoelectric element.

22. The vibration generation device of claim 1, wherein at least any one member at a portion which the vibrator and the inner surface of the housing face each other is provided with a damper.

23. The vibration generation device of claim 22, wherein the damper is disposed on an outer end of the vibrator or the inner surface of the housing opposed thereto.

24. The vibration generation device of claim 23, wherein the damper is formed of a material including at least any one of urethane foam, silicon foam, and rubber.

25. The vibration generation device of claim 24, wherein the damper is an elastic body and is formed of a noise absorbing material.

26. The vibration generation device of claim 1, further comprising an additional elastic member having one end fixed to the vibrator and the other end fixed to the housing.

27. The vibration generation device of claim 26, wherein the additional elastic member is at least one coil spring or at least one leaf spring.

28. The vibration generation device of claim 1, wherein the piezoelectric element has a quadrangular pillar shape in which a length in a horizontal direction is longer than that in a vertical direction.

29. The vibration generation device of claim 28, wherein the housing has a quadrangular pillar shape in which a length in a horizontal direction is longer than that in a vertical direction.

* * * * *